(12) United States Patent
Singh et al.

(10) Patent No.: US 8,105,754 B2
(45) Date of Patent: Jan. 31, 2012

(54) FUNCTIONALIZED FULLERENES FOR NANOLITHOGRAPHY APPLICATIONS

(75) Inventors: Amit Kumar Singh, Gainesville, FL (US); Vijay Krishna, Gainesville, FL (US); Brij M. Moudgil, Gainesville, FL (US); Benjamin L. Koopman, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 12/810,241

(22) PCT Filed: Jan. 5, 2009

(86) PCT No.: PCT/US2009/030115
§ 371 (c)(1),
(2), (4) Date: Sep. 13, 2010

(87) PCT Pub. No.: WO2009/089158
PCT Pub. Date: Jul. 16, 2009

(65) Prior Publication Data
US 2011/0003252 A1    Jan. 6, 2011

Related U.S. Application Data

(60) Provisional application No. 61/010,169, filed on Jan. 4, 2008.

(51) Int. Cl.
*G03C 5/00*     (2006.01)
(52) U.S. Cl. ........ 430/296; 430/313; 430/323; 430/326; 430/942
(58) Field of Classification Search .................. 430/296, 430/313, 323, 326, 942
See application file for complete search history.

(56) References Cited

U.S. PATENT DOCUMENTS

| 5,561,026 A * | 10/1996 | Aoki ............................ 430/196 |
| 6,117,617 A | 9/2000 | Kanayama et al. |
| 6,177,231 B1 | 1/2001 | Ishii et al. |
| 2009/0302029 A1 * | 12/2009 | Krishna et al. ................ 219/678 |

FOREIGN PATENT DOCUMENTS

| JP | 11-143074 | 5/1999 |
| JP | 11-258796 | 9/1999 |
| JP | 18-265130 | 10/2006 |
| KR | 10-2000-00265 49 | 5/2000 |

OTHER PUBLICATIONS

Chen, X. et al., "A high resolution water soluble fullerene molecular resist for electron beam lithography," *Nanotechnology*, 2008, pp. 1-5, vol. 19.
Tada, T. et al., "Nanolithography Using Fullerene Films as an Electron Beam Resist," *Jpn. J. Appl. Phys.*, Jan. 1996, pp. L63-L65, vol. 35, Part 2, No. 1A.
Tada, T. et al., "Improved Sensitivity of Multi-adduct Derivatives of Fullerene," *Journal of Photopolymer Science and Technology*, 2001, pp. 543-546, vol. 14, No. 4.

* cited by examiner

*Primary Examiner* — Christopher Young
(74) *Attorney, Agent, or Firm* — Saliwanchik, Lloyd & Eisenschenk

(57) ABSTRACT

A method for electron beam nanolithography without the need for development step involves depositing a film of a resist comprising functionalized fullerenes on a substrate, and writing features by exposure to an electron beam with an accelerating voltage and dose rate sufficient to promote heating or thermal degradation of the functionalized fullerene in the irradiated volume such that a pattern is generated without a subsequent development step or with an aqueous developer. Lithographic features of about 1 nm or greater can be formed.

20 Claims, 2 Drawing Sheets

(a)  (b)  (c)  200 μm h = 10 nm    a = 50 nm
b = 200 nm   t = 200 nm

FUNCTIONALIZED FULLERENES FOR NANOLITHOGRAPHY APPLICATIONS

CROSS-REFERENCE TO RELATED APPLICATION(S)

This application is the U.S. national stage application of International Patent Application No. PCT/US2009/030115, filed Jan. 5, 2009, which claims the benefit of U.S. Provisional Application Ser. No. 61/010,169, filed Jan. 4, 2008, the disclosures of which are hereby incorporated by reference in their entireties, including any figures, tables, or drawings.

The subject invention was made with government support under the National Science Foundation, Contract No. EEC9402989. The government has certain rights to this invention.

BACKGROUND OF THE INVENTION

The creation of well-defined micron-scale features upon a surface is the foundation of the microelectronics industry. Small features raise the efficiency of a microelectronic device and, ultimately, the ability to create smaller features drives advancement in the semiconductor industry. Photolithography has been the dominant method for fabrication of microcircuitry since the first semiconductor transistor circuit was developed. In a photolithography process, a monochromatic light is projected through a mask to create, generally after a development step, a pattern in a resist material supported on a substrate, generally a semiconductor. The patterned resist material protects portions of the substrate during a subsequent doping or etching processes of the exposed areas to alter the electronic or topographic features of the substrate.

Photolithography relies upon focusing of a shadow pattern produced from a mask to reduce feature sizes. When a "perfect" lens is used, the resolution of the features is said to be diffraction limited, where the minimum feature size attainable is limited only by the size of features in the mask where diffraction of the light projected through it occurs. Hence, improvement of the resolution of features attainable with photolithography requires a smaller wavelength of light so that a smaller aperture can be used.

Of the five identified alternatives to optical lithography for sub 50 nm lithography: extreme ultraviolet (EUV); x-ray; imprint; ion beam projection; and electron beam lithography (EBL), EBL is the most mature. EBL provides a solution to the problem of diffraction limitation.

The wavelength of an electron accelerated by a potential is given by:

$$\lambda = 1.2/(V_b)^{1/2}$$

where $V_b$ is the accelerating voltage of the electron beam. For example, at 25 kV the wavelength of the electron is 0.008 nm. For direct-write applications, the electron beam can be delivered by a scanning electron microscope where resolution is not fixed by the diffraction limit, but rather resolution is limited primarily by the diameter to which the electron beam can be focused. Electron beams have been focused to less than 1 nm, and the ultimate practical limit for the resolution of electron beam lithography is considered to be about 7 nm.

As with all resists, electron beam resists can be divided into two broad classes: positive tone resists that are removed more easily after exposure to the radiation and negative tone resists that are made more resistant to removal after exposure to the radiation. A typical mechanism for forming a negative tone resist is an increase in molecular weight by polymerization or cross-linking to cause a decrease in solubility of the exposed area to a developer. A positive tone resist mechanism typically involves a lowering of molecular weight through chain scission or involves a functional group conversion to cause an increase in the solubility of the exposed area to a developer.

The sensitivity of the resist material is of fundamental importance. The sensitivity of an electron beam resist relates to the dose of electrons required to expose an area of the film. The more sensitive the resist is to the electron beam, the faster it can be processed. This sensitivity is typically determined by exposing the resist to a range of electron doses, where after development, the thickness of the film in the exposed areas is measured. In the case of a negative tone electron beam resist, the thickness increases with dose.

The best commercially available electron beam resists are relatively simple polymers, such as poly(methyl methacrylate) (PMMA). PMMA was one of the first electron beam resists, discovered shortly after the application of SEM to lithography and is commonly used as a standard for comparison with other electron beam resists. PMMA is commonly supplied for electron beam resists as 496,000 or 950,000 g/mole molecular weight (MW) polymer as a chlorobenzene or anisole solution. It is then typically deposited by spin coating followed by baking at 170-200° C. to form the resist film on the substrate. PMMA can act as either a positive or a negative tone electron beam resist, depending on the dose of electrons delivered to it.

The sensitivity of PMMA in the positive tone dose regime depends on the electron beam accelerating voltage. The sensitivity decreases from $1.0 \times 10^{-5}$ C cm$^{-2}$ at 2 keV, to $9 \times 10^{-5}$ C cm$^{-2}$ at 20 keV, and to $3.5 \times 10^{-4}$ C cm$^{-2}$ at 50 keV. The resolution of positive tone PMMA is very high under optimal lithographic conditions with, for example, 6 nm features formed using 1,100,000 MW PMMA at 80 keV followed by development with a 3:7 cellosolve:methanol solution.

In the negative tone dose regime, the sensitivity of PMMA is lower ($\sim 1 \times 10^{-3}$ C cm$^{-2}$) with 10-20 nm features formed. However, because the etch durability of PMMA is lower than that of a silicon, PMMA's utility has some limitations. This shortcoming has been addressed by the addition of $C_{60}$ or a $C_{60}$ derivative to the PMMA, as disclosed in Ishii et al., U.S. Pat. No. 6,177,231. The fullerene particles increase the etch durability of the PMMA with an enhancement of the contrast of the resist pattern upon development with a solution appropriate for the fullerene particles. Similar improvements to positive tone resists are also achieved. The fullerene particles were used to enhance the etching resistance by reducing free space within the resist film and inhibiting penetration of etching reactive species into the resist film. The sensitivity of the PMMA containing fullerene particles was an order of magnitude higher than fullerene free PMMA, and superior lines are formed using doses of about 5 µC cm$^{-2}$.

Tada et al., *Jpn. J. Appl. Phys.*, 1996, Part 2, 35, L63, discloses $C_{60}$ as a negative tone electron beam resist material. Si patterns with feature sizes in silicon as low as 20 nm were achieved. The etch durability of $C_{60}$ is excellent, being 10/1 compared with silicon. $C_{60}$, however, is insoluble in water and only sparingly soluble in organic solvents, making it unsuitable for spin coating, and its sensitivity is much lower ($1 \times 10^{-2}$ C cm$^{-2}$) than PMMA ($5.0 \times 10^{-5}$ C cm$^{-2}$).

Tada et al., *J. Photopolym. Sci. Technol.*, 2001, 14, 4, 543, discloses various modified $C_{60}$ derivatives that dramatically improve the film forming and electron beam resist properties relative to $C_{60}$. The $C_{60}$ derivatives were spin coated as a 300 nm thick film, exposed to a 20 keV electron beam, and developed using chlorobenzene. It was shown that these negative tone resists display better sensitivity ($2.5 \times 10^{-3}$ to $3.8 \times 10^{-4}$ C cm$^{-2}$) than that of $C_{60}$ but a lower sensitivity than PMMA.

Hence, although an improvement of the electron beam resist's etch resistance by the inclusion of fullerene particles has been demonstrated, other limitations still exist in the process that, if eliminated or improved, could improve the contrast and resolution of the process. For example, the development step of the exposed film relies on the solubility differences of the exposed and unexposed resist. Improving this development step has the potential to significantly improve the overall lithographic process. Therefore, a lithographic process that directly forms the pattern without development is highly desirable.

BRIEF SUMMARY OF THE INVENTION

A method for electron beam lithography involves deposition of a resist comprising functionalized fullerenes on a substrate and projection of an electron beam upon the resist, where the accelerating voltage and dose rate is sufficiently large to cause thermal degradation of the functionalized fullerenes and any surrounding resist material. The degradation directly yields a pattern of voids without the need for a separate development step. The functionalized fullerenes can be combined with a polymer, such as poly(methyl methacrylate) or other polymers commonly used for electron beam resists, to form the functionalized fullerene comprising resist. The functionalized fullerenes can be 0.01 to 100 weight percent of the resist.

The functionalized fullerenes include fullerenes ($C_x$ where x is 20 to 1500) with functional groups attached to the fullerene by covalent bonds, ionic bonds, or Dewar coordination, Kubas interactions, or any combination thereof. Useful functional groups include, but are not restricted to, OH, Br, H, Gd, Ti, or $C(COOH)_2$ groups. The functional groups can be chosen to enhance the solubility of the functionalized fullerene in the functionalized fullerene comprising resist, or a solvent for its deposition, in addition to providing the ability to generate heat in oxygen-free atmosphere or combust in the presence of oxygen to create the voids upon irradiation. Functionalized fullerenes include substituted fullerenes and endohedral fullerenes. Substituted fullerenes are fullerenes in which one or more of the atoms which comprise the fullerene cage structure are replaced by an atom other than carbon. Endohedral fullerenes have additional atoms, ions, or clusters enclosed within their inner spheres. The functionalized fullerene comprising resist can be irradiated with electron beam in case of e-beam lithography or electromagnetic radiation such as extreme ultraviolet in case of photolithography. The electron beam acceleration voltage can be 1 to 30 kV or less with a dose rate of at least 10 $cm^{-2}$. Other accelerating voltages or dose rates can be used that are sufficient to heat or combust the functionalized fullerenes.

The functionalized fullerene comprising resist can be dissolved in a solvent and spin coated on a substrate, where the thickness of the resist coating is determined by the parameters that define the thickness of a resist by spin coating, including the spinning rate and solution viscosity. Hydroxyl functionalized fullerenes can be used in a water developable functionalized fullerene comprising resist.

The method allows for the direct development of the features of the resist immediately upon irradiation with the electron beam. No subsequent development step using a selective solvent is required to expose the substrate for a subsequent doping or etching of the exposed substrate. The method allows for a water-developable resist where features can be formed upon exposure to water or a water based solution.

DETAILED DESCRIPTION OF THE INVENTION

Figure 1:
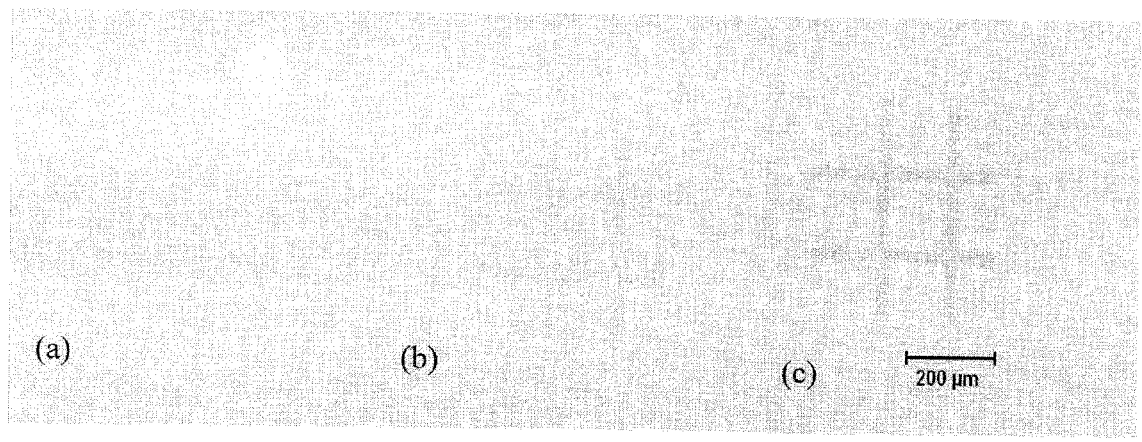
FIG. 1 is a reproduction of an optical image of three functionalized fullerene comprising resists having been electron beam patterned to yield lines and square boxes without a development step where the pattern displays (a) a square area using a 20 $\mu C\ cm^{-2}$ dose and lines using a 50 $\mu C\ cm^{-2}$ dose, (b) a square area using a 100 $\mu C\ cm^{-2}$ dose and lines using a 200 $\mu C\ cm^{-2}$ dose, and (c) a square area using a 500 $\mu C\ cm^{-2}$ dose and lines using a 900 $\mu C\ cm^{-2}$ dose.

The inventors have discovered that functionalized fullerenes, such as polyhydroxy fullerenes (PHF) and carboxy fullerenes (CF), produce significant localized heating when exposed to a high energy electron beam. This local heating occurs within a localized volume around the electron beam exposed functionalized fullerene, promoting thermal decomposition of the irradiated volume, forming a void. In the presence of oxygen, the electron beam can ignite the functionalized fullerene and any immediately adjacent matrix material with the loss of gaseous combustion products to form the void, the lithographic feature. In absence of oxygen, the electron beam can sufficiently heat the functionalized fullerenes causing scission of bonds in immediately adjacent matrix material. As a single functionalized fullerene molecule can have a diameter of less than 1 nm, features with dimensions of as little as 1 nm can be formed. Because the resist addressed by the electron beam is converted into gaseous products, no development step is required before conducting a step of doping or etching an underlying substrate. In another embodiment toxic solvents can be avoided during coating and development steps, as non-toxic solvents, such as water, can be employed to greatly improve the safety of lithographic processes.

The inventive nanolithographic process comprises the deposition of a functionalized fullerene comprising resist on a substrate, and exposing the resist to high energy electron beams with a sufficient dosage to decompose the electron beam addressed functionalized fullerene comprising resist to yield a developed patterned resist. Additionally, the developed resist can be doped or etched to form the desired doping pattern or topography within the substrate.

The functionalized fullerenes can be deposited in any manner that forms a continuous film on the substrate. The functionalized fullerenes can be dispersed in a solvent and spin-coated on a substrate where the functionalized fullerene comprising resist is exclusively the functionalized fullerenes. The coated substrate can then be baked to remove some or all of the solvent to leave a planarized film. The resist can comprise the functionalized fullerenes and an organic polymer. The polymer can be included as 0 to 99.99 wt % of the resist. The polymer can act as a matrix for embedded functionalized fullerenes. As necessary, when the functionalized fullerene is not directly miscible with the polymer, an interfacial stabilizing agent, such as a surfactant or block copolymer, can be employed to form a stable homogeneous dispersion of functionalized fullerenes in the polymer. The polymer can act as a viscosity modifier of the resist solution to control the thickness of the resist coating on the substrate. For example, polyhydroxy fullerenes can be dissolved in water and poly(acrylic acid) can be added in an amount sufficient to achieve a desired viscosity of the aqueous solution, with the proportions of the polyhydroxy fullerenes, poly(acrylic acid), and water determining the viscosity of the solution to be spun on the substrate and ultimately the thickness of the resulting resist film after baking or otherwise removing volatiles, such as the solvent, from the deposited film.

The functionalized fullerene comprising resist can include any polymer or other material that can be employed as a positive tone electron beam resist. Organic polymers commonly employed as positive tone electron beam resists that may be used as a component of the functionalized fullerene comprising resist include, for example, poly(methyl methacrylate). PMMA may be combined with functionalized fullerenes using any solvent or combination of solvents to form a homogeneous resist formulation. In addition, resist formulations based on poly(2,2,2-trifluoroethyl-chloroacrylate), poly(butene-1-sulfone), and copolymers of chloromethacrylate and methylstyrene can be combined with the functionalized fullerenes to form resists that can be used in various embodiments of the invention. Other polymers that can be used in other embodiments of the invention include poly(methyl methacrylate), poly (vinyl alcohol), poly (acrylic acid), poly (vinyl pyrrolidone), poly (ethylene glycol), poly (lactic co-glycolic acid), poly (ethylene oxide), carboxy methyl cellulose, or carbopol.

Because the resist pattern results upon ignition or thermal degradation of the functionalized fullerene and immediately surrounding matrix, any material that can undergo degradation or combustion can be deposited with the functionalized fullerenes to form a planar film. For this reason, many materials that might be used as a negative tone electron beam resist can be used in the inventive positive tone nanolithographic process, even if the included material undergoes polymerization or cross-linking, as long as it can undergo thermal decomposition or combustion. The functionalized fullerenes can be chosen to provide a desired etch resistance relative to the substrate upon which the resist is deposited.

For the purpose of this invention, the term "fullerenes" is used to define a general class of molecules that exists essentially in the shape of a three dimensional polyhedron containing from 20 to 1500 carbon atoms, and which comprises carbon atoms as the predominant element from which they are composed. The fullerenes include but are not limited to C-28, C-32, C-44, C-50, C-58, C-60, C-70, C-84, C-94, C-250 and C-540. (According to this nomenclature, the fullerene which contains 60 carbon atoms is denoted C-60, the fullerene which contains 70 carbon atoms is denoted C-70, etc.) Functionalized fullerenes include fullerenes ($C_x$ where x is 20 to 1500) with side groups attached to the outer surface of the cage via covalent bonds, ionic bonds, or Dewar coordination, or Kubas interactions, or any combination thereof. The side groups can be either inorganic, including, but not exclusive to, OH, Br, $H_2$, Gd, Ti, organic, including, but not exclusive to, $C(COOH)_2$, or any combination of organic and/or inorganic functional groups. The number of functional groups attached per cage of fullerene can vary from 1 to a majority of the number of carbons in the fullerene cage. Also included among the functionalized fullerenes for the purposes of the invention are the substituted fullerenes. These are fullerenes in which one or more of the atoms which comprise the fullerene cage structure is replaced by an atom other than carbon, such as nitrogen, boron or titanium, yet essentially retain the geometry of a polyhedron upon being so substituted. Also included among the functionalized fullerenes are endohedral fullerenes in which atoms of elements other than carbon (e.g., iron) reside inside the cage structure. Functionalized fullerenes have different physical and chemical properties based on the type and number of side groups, endohedral elements, and substituted elements. The functionalized fullerenes, which are formally molecules, have dimensions that are in excess of a nanometer in diameter and as such constitute nanoparticles.

The functionalized fullerenes and any organic polymer can be chosen because of various processing factors, such as ease and rate of fabrication, resistance to an etchant, and any other material parameters that promote high sensitivity of the resist, and high resolution and contrast of the lithographically formed features.

A variety of solvents can be used depending upon the functionalized fullerene or functionalized fullerenes and any polymer or polymers included in the resist formulation. For example, in one embodiment of the invention, as indicated above, polyhydroxy fullerenes and poly(acrylic acid) can be combined with water to form an aqueous solution. Such an aqueous electron beam resist can be non toxic and some waste problems inherent to chip fabrication can be alleviated or avoided by the use of such a resist.

The functionalized fullerenes can be dissolved or dispersed in the solvent. It is known to those skilled in the art that because of the nanoscale size of functionalized fullerenes, as well as their solubility in polar and non-polar solvents, the terms such as "dissolve," "disperse" and "suspend" can be interchangeable herein, as can be "solution," "dispersion" and "suspension," as in some cases it is not readily apparent that for the liquid phase employed if a true solution or a suspension is formed. In some embodiments of the invention, as is obvious to one skilled in the art, a solution and dispersion are distinct entities.

The electron beam irradiation can be carried out using an acceleration voltage of 10 kV or less, although higher acceleration voltages can be applied, for example, 25 or 30 kV. Electron beam irradiation can be carried out at or above a dose rate where sufficient heating occurs to decompose the resist. Typical dose rates are at 10 kV at least 10 $\mu C\ cm^{-2}$ to about 1,000 $\mu C\ cm^{-2}$ or more. For example dose rates can be 20, 50, 100, 200, 500 or 900 $\mu C\ cm^{-2}$.

EXAMPLES

Example 1

A commercially available electron beam resist, (PMMA A2 950K in anisole; Microchem, Newton, Mass.) was purchased and a homogeneous solution was prepared by dissolving a functionalized fullerene, $C_{60}H_{18}$ to $C_{60}H_{20}$, at 0.1 weight % in the PMMA resist solution. This solution was spin coated on the surface of a silicon wafer resulting in a film with the approximate thickness of 200 nm. After the coating step, the wafer was baked in an oven at 190° C. for 45 minutes. A Raith-150 direct write electron beam lithography tool was employed for irradiation of a nanostructured pattern with an electron beam having a 10 kV accelerating voltage using software provided with the tool.

Example 2

Figure 2:
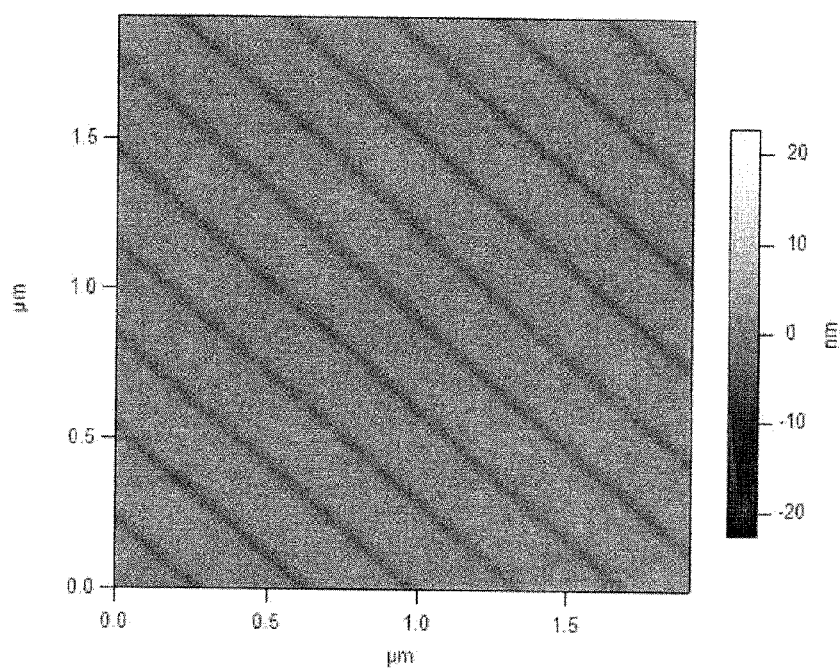
FIG. 2 is an atomic force microscope (AFM) image of a portion of the square box of FIG. 1(c) that shows the nanometer sized features within the square box with voids having a width of about 50 nm.
Figure 3:
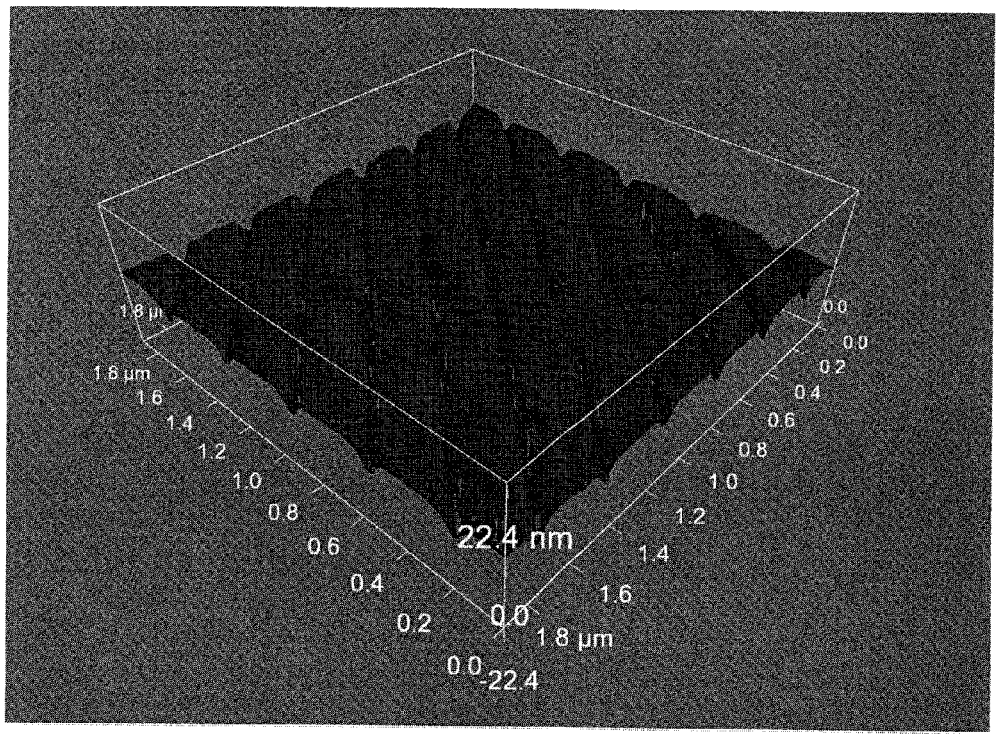
FIG. 3 is a 3-D projection of the portion of the square box displayed in FIG. 2 with voids having a depth of about 10 nm.
Figure 4:
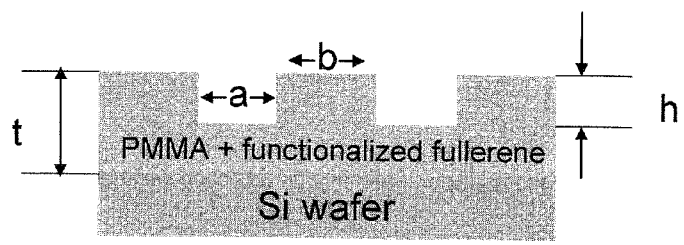
FIG. 4 is a schematic representation of the dimensions of the nanometer sized features within the square box illustrated in FIGS. 2 and 3.

The electron beam exposed coated substrate of Example 1 was examined using an optical microscope and an Atomic Force Microscope (AFM). An optical image of the exposed wafer without any traditional development step is shown in FIG. 1. This image consists of 25 microns wide lines and 50×50 microns square. The square boxes contain additional features with nanometer dimensions. These square boxes were imaged with AFM. The AFM image of a portion of the box is displayed in FIG. 2. The lines have widths of approximately 50 nm. FIG. 3 is a three-dimensional image of the portion of the box displayed in FIG. 2 and shows that the depth of the lines is approximately 10 nm. A schematic is given in FIG. 4 of the patterned substrate of the boxes illustrating the approximate dimensions.

All patents, patent applications, provisional applications, and publications referred to or cited herein, supra or infra, are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. A development free method for electron beam lithography comprising the steps of:
    depositing a resist comprising functionalized fullerenes on a substrate; and
    projecting an electron beam upon said resist with an accelerating voltage and dose rate that initiates thermal degradation of said resist, wherein a pattern of voids is formed in said resist.

2. The method according to claim 1, wherein said step of depositing comprises:
    combining said resist with a solvent to form a resist solution; and
    spin-coating said resist solution on said substrate.

3. The method of claim 1, wherein said functionalized fullerenes comprise:
    fullerenes ($C_x$ where x is 20 to 1500) with side groups attached to said fullerene by covalent bonds, ionic bonds, or Dewar coordination, Kubas interactions, or any combination thereof;
    substituted fullerenes;
    endohedral fullerenes; or
    any combinations thereof.

4. The method of claim 3, wherein said side groups comprise OH, Br, H, Gd, Ti, or $C(COOH)_2$.

5. The method according to claim 1, wherein said resist comprises at least one functionalized fullerene and at least one organic polymer.

6. The method according to claim 5, wherein said polymer comprises poly(methyl methacrylate), poly(2,2,2-trifluoroethyl-chloroacrylate), poly(butene-1-sulfone), a copolymer of chloromethacrylate and methylstyrene, polyvinyl alcohol, carboxy methyl cellulose, or carbopol.

7. The method according to claim 1, wherein said resist is water soluble.

8. The method according to claim 1, wherein said accelerating voltage is 1 to 30 kV and said dose rate is at least 10 μC $cm^{-2}$.

9. The method according to claim 1, further comprising the step of doping said substrate exposed by said voids in said resist.

10. The method according to claim 1, further comprising the step of etching said substrate exposed by said voids in said resist.

11. A water-developable method for electron beam lithography comprising the steps of:
    depositing a resist comprising functionalized fullerenes on a substrate;
    projecting an electron beam upon said resist having an accelerating voltage and dose rate wherein thermal degradation of said resist occurs; and
    developing the resist with water wherein a pattern of voids is formed in said resist.

12. The method according to claim 11, wherein said step of depositing comprises:
    combining said resist with a solvent to form a resist solution; and
    spin-coating said resist solution on said substrate.

13. The method of claim 11, wherein said functionalized fullerenes comprise:
    fullerenes ($C_x$ where x is 20 to 1500) with side groups attached to said fullerene by covalent bonds, ionic bonds, or Dewar coordination, Kubas interactions, or any combination thereof;
    substituted fullerenes;
    endohedral fullerenes; or
    any combination thereof.

14. The method of claim 13, wherein said side groups comprise OH, Br, H, Gd, Ti, or $C(COOH)_2$.

15. The method according to claim 11, wherein said resist comprises at least one functionalized fullerene and at least one organic polymer.

16. The method according to claim 15, wherein said polymer comprises poly(methyl methacrylate), poly (vinyl alcohol), poly (acrylic acid), poly (vinyl pyrrolidone), poly (ethylene glycol), poly (lactic co-glycolic acid), poly (ethylene oxide), carboxy methyl cellulose, or carbopol.

17. The method according to claim 11, wherein said resist is water soluble.

18. The method according to claim 11, wherein said accelerating voltage is 1 to 30 kV and said dose rate is at least 10 μC $cm^{-2}$.

19. The method according to claim 11, further comprising the step of doping said substrate exposed by said voids.

20. The method according to claim 11, further comprising the step of etching said substrate exposed by said voids.

* * * * *

UNITED STATES PATENT AND TRADEMARK OFFICE
CERTIFICATE OF CORRECTION

| | | |
|---|---|---|
| PATENT NO. | : 8,105,754 B2 | |
| APPLICATION NO. | : 12/810241 | |
| DATED | : January 31, 2012 | |
| INVENTOR(S) | : Amit Kumar Singh et al. | |

It is certified that error appears in the above-identified patent and that said Letters Patent is hereby corrected as shown below:

Column 3,
Line 47, "10 cm$^{-2}$" should read --10 μC cm$^{-2}$--.

Signed and Sealed this
Seventeenth Day of April, 2012

David J. Kappos
*Director of the United States Patent and Trademark Office*